United States Patent
Cho et al.

(10) Patent No.: US 7,057,433 B2
(45) Date of Patent: Jun. 6, 2006

(54) DELAY-LOCKED LOOP (DLL) CAPABLE OF DIRECTLY RECEIVING EXTERNAL CLOCK SIGNALS

(75) Inventors: Guen-Hee Cho, Suwon (KR); Kyu-Hyoun Kim, Suwon (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 23 days.

(21) Appl. No.: 10/774,933

(22) Filed: Feb. 9, 2004

(65) Prior Publication Data

US 2004/0222829 A1 Nov. 11, 2004

(30) Foreign Application Priority Data

Apr. 14, 2003 (KR) ................ 10-2003-0023352

(51) Int. Cl.
*H03L 7/00* (2006.01)
(52) U.S. Cl. ....................... 327/161; 327/153
(58) Field of Classification Search .............. None
See application file for complete search history.

(56) References Cited

U.S. PATENT DOCUMENTS

| | | | | |
|---|---|---|---|---|
| 6,404,248 B1 * | 6/2002 | Yoneda | ............ | 327/158 |
| 6,661,265 B1 * | 12/2003 | Partsch et al. | ............ | 327/158 |
| 6,680,635 B1 * | 1/2004 | Lee | ............ | 327/158 |
| 6,815,985 B1 * | 11/2004 | Jeon | ............ | 327/115 |

* cited by examiner

*Primary Examiner*—Timothy P. Callahan
*Assistant Examiner*—Cassandra Cox
(74) *Attorney, Agent, or Firm*—F. Chau & Associates, LLC

(57) ABSTRACT

A delay-locked loop (DLL) capable of directly receiving external clock signals is provided. The DLL comprises a level selector, a control signal generator, and an internal clock signal generator. The level selector receives an external clock signal, and directly outputs the external clock signal, or changes a level of the external clock signal and outputs a changed external clock signal, in response to a control signal. The control signal generator generates the control signal. The internal clock signal generator receives an output signal of the level selector and the external clock signal, and generates an internal clock signal synchronized to a phase of an output signal of the level selector.

24 Claims, 7 Drawing Sheets

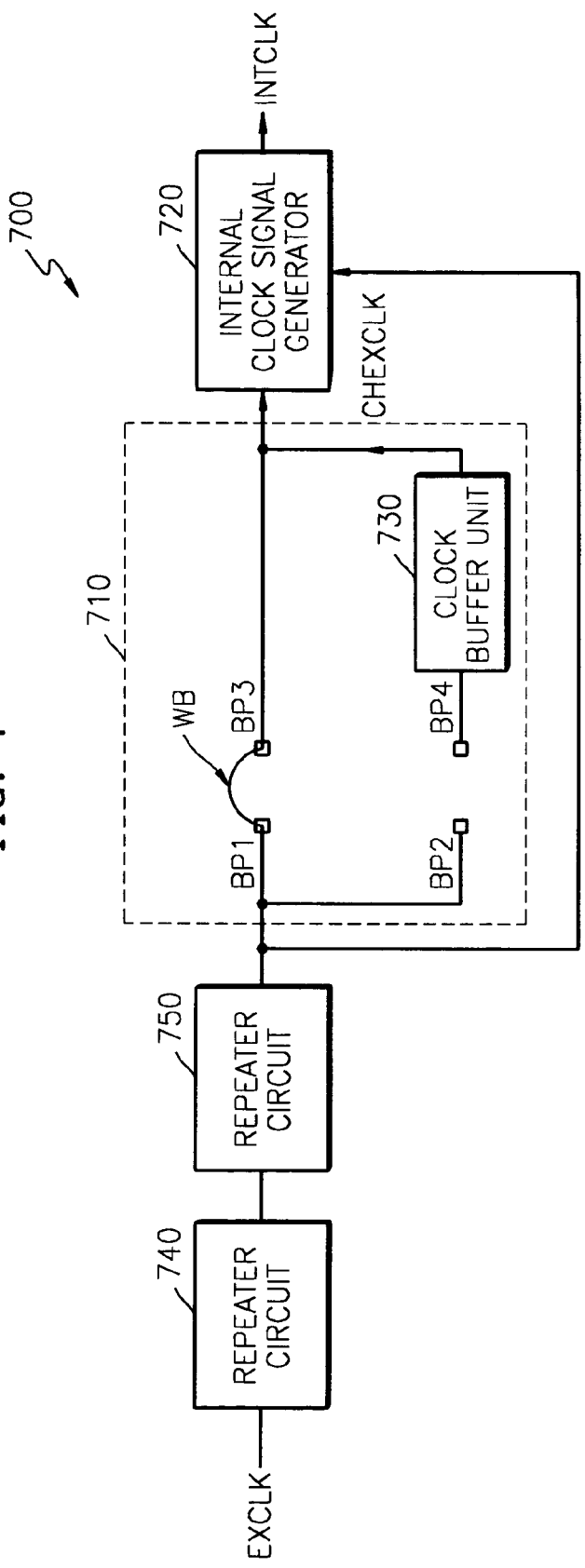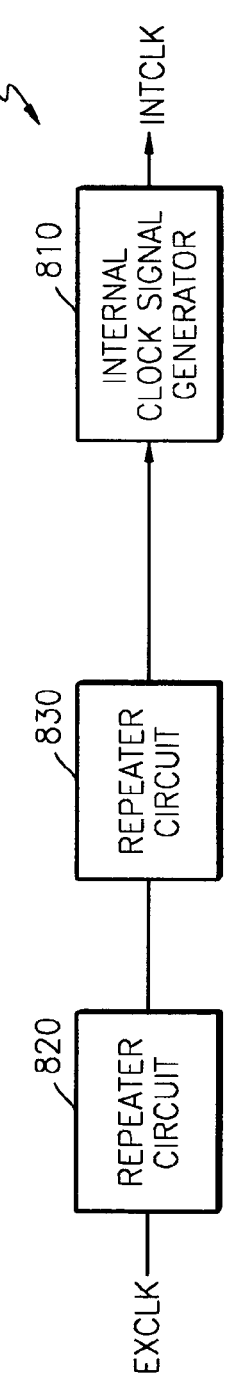

DELAY-LOCKED LOOP (DLL) CAPABLE OF DIRECTLY RECEIVING EXTERNAL CLOCK SIGNALS

BACKGROUND OF THE INVENTION

1. Technical Field

The present invention relates to a Delay-Locked Loop (DLL) and more particularly, to a DLL capable of directly receiving external clock signals.

2. Discussion of the Related Art

In a typical input/output (I/O) interface method in which data is synchronously transmitted with a clock frequency, such as when data is transmitted between a memory device and a memory controller, a correct synchronization between a clock signal and the data becomes increasingly important due to an expanding bus load and rising clock frequency.

Thus, it is necessary to correctly locate the data at an edge or a center of the clock signal by considering the transmission time of the data when it is transmitted from components to buses. Circuits commonly used for this purpose include a Phase-Locked Loop (PLL) and a Delay-Locked Loop (DLL).

A difference between the PLL and the DLL is that the PLL uses a Voltage Controlled Oscillator (VCO) as a synchronization circuit, while the DLL uses a Voltage Controlled Delay Line (VCDL) as a synchronization circuit.

The PLL including the VCO generally allows clock multiplication, however, a jitter accumulates in the VCO. A DLL using a delay line does not allow clock multiplication, however, it does not cause jitter accumulation. Therefore, a semiconductor memory such as a dynamic random access memory (DRAM) uses a DLL that has suitable clocking and jitter characteristics because its input and output frequencies are the same.

However, when the DLL receives an external clock signal, the DLL amplifies and receives a level of the external clock signal, which typically has a Transistor-Transistor Logic (TTL) level, using an amplifying buffer. The amplifying buffer then amplifies the external clock signal with the TTL level to a Complementary Metal Oxide Semiconductor (CMOS) level. Thus, in a case where delay cells of the delay line of the DLL receiving the external clock signal are differential amplifier type analog cells, the DLL can directly receive the external clock signal having the TTL level without using the amplifying buffer. In this case, however, use of the amplifying buffer consumes time for buffering and increases current consumption.

SUMMARY OF THE INVENTION

The present invention provides a Delay-Locked Loop (DLL) capable of directly receiving an external clock signal without amplifying the external clock signal using an amplifying buffer. Advantageously, the DLL can increase clock synchronization speed and reduce current consumption by selectively directly receiving the external clock signal.

According to an aspect of the present invention, there is provided a DLL comprising a level selector, a control signal generator, and an internal clock signal generator. The level selector receives an external clock signal and directly outputs the external clock signal, or changes a level of the external clock signal and outputs a level-changed external clock signal, in response to a control signal. The control signal generator generates the control signal. The internal clock signal generator receives an output signal of the level selector and the external clock signal, and generates an internal clock signal synchronized to a phase of the output signal of the level selector.

The level selector comprises a selection controller and a clock buffer unit. The selection controller directly applies the external clock signal to the internal clock signal generator, or outputs the external clock signal as a level control signal, in response to the control signal. The clock buffer unit generates the changed external clock signal in response to the level control signal.

The selection controller comprises, a first transmission gate, which directly applies the external clock signal to the internal clock signal generator, in response to a first level of the control signal; a second transmission gate, which outputs the external clock signal as the level control signal, in response to a second level of the control signal; and an inverter, which inverts a logic level of the control signal and applies the inverted control signal to the first and the second transmission gates.

The clock buffer amplifies a level of the external control signal to a Complementary Metal Oxide Semiconductor (CMOS) level. The control signal generator generates the control signal in response to command signals. The control signal is a Mode Register Set (MRS) signal.

The control signal generator comprises, a first bonding pad, a second bonding pad, and a third bonding pad, which is connected to the second bonding pad using a bonding wire and generates the control signal.

The control signal generator comprises: a first transistor; a second transistor; a third transistor; a first inverter; and a second inverter which inverts an output signal of a second node and outputs the inverted output signal as the control signal.

The external clock signal has a Transistor-Transistor Logic (TTL) level. The internal clock signal generator comprises, a phase controller, which outputs an output signal of the level selector as the internal clock signal, in response to first and second control signals; a feedback unit, which compares a phase of the internal clock signal with a phase of the external clock signal and generates an up/down signal and a mode signal; and a phase control signal generator, which generates the first and the second control signals for controlling a phase of the output signal of the level selector, in response to the mode signal and the up/down signal, wherein the phase controller includes a delay chain for receiving the output signal of the level selector. The delay chain includes differential amplifier type analog delay cells having a small swing width. The level selector receives the external clock signal through a repeater circuit.

According to another aspect of the present invention, there is provided a DLL comprising a level selector and an internal clock signal generator. The level selector receives an external clock signal and directly outputs the external clock signal, or changes a level of the external clock signal and outputs a changed external clock signal. The internal clock signal generator receives an output signal of the level selector and the external clock signal, and generates an internal clock signal synchronized to a phase of the output signal of the level selector.

The level selector comprises: a clock buffer unit which receives the external clock signal and outputs the changed external clock signal; a first metal line which directly applies the external clock signal to the internal clock signal generator; and a second metal line which applies the external clock signal to the clock buffer unit, wherein one of the first metal line and the second metal line is connected and the other of the first metal line and the second metal line is disconnected.

The level selector comprises: a clock buffer unit which receives the external clock signal and outputs the changed external clock signal; a first pad which receives the external clock signal; a second pad which receives the external clock signal; a third pad which corresponds to the first pad and is connected to the internal clock signal generator; and a fourth pad which corresponds to the second pad and is connected to the clock buffer unit, wherein one pair among the first and the third pads and the second and the fourth pads is connected using a bonding wire.

According to still another aspect of the present invention, there is provided a DLL comprising a phase controller, a feedback unit, and a phase control signal generator. The phase controller outputs a phase-controlled external clock signal as an internal clock signal. The feedback unit generates an up/down signal and a mode signal. The phase control signal generator generates a first and a second phase control signal for controlling the phase of the external clock signal. The phase controller includes a delay chain for receiving the output signal of the level selector, and the external clock signal is directly applied to the phase controller.

BRIEF DESCRIPTION OF THE DRAWINGS

The above features of the present invention will become more apparent by describing in detail exemplary embodiments thereof with reference to the attached drawings, in which:

FIG. 7 is a block diagram of a DLL, according to yet another exemplary embodiment of the present invention; and FIG. 8 is a block diagram of a DLL, according to another exemplary embodiment of the present invention.

DETAILED DESCRIPTION OF EXEMPLARY EMBODIMENTS

Figure 1:
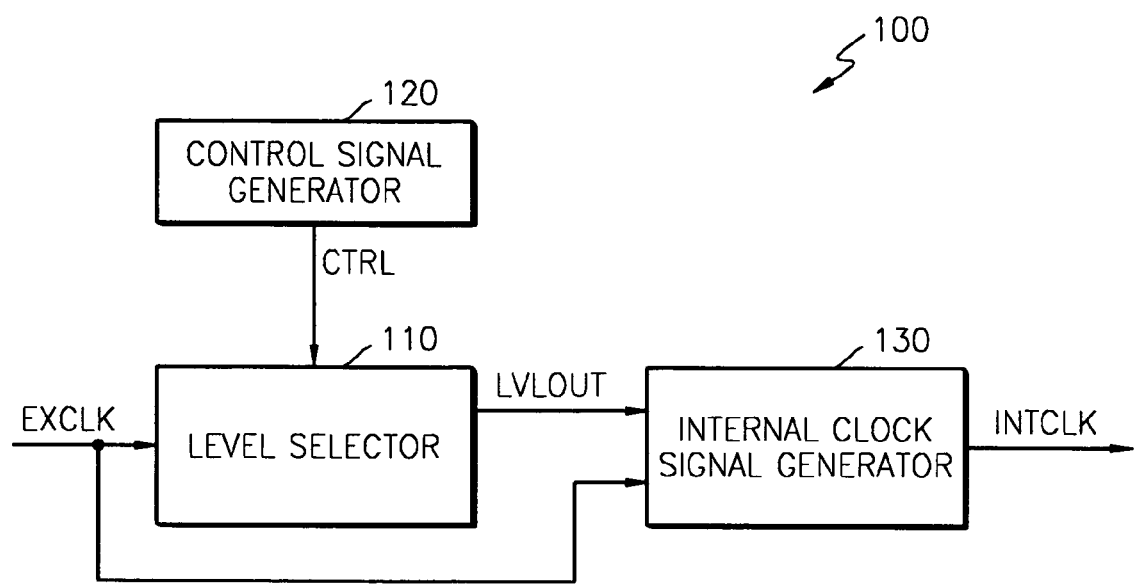
FIG. 1 is a block diagram of a Delay-Locked Loop (DLL), according to an exemplary embodiment of the present invention.

FIG. 1 is a block diagram of a Delay Locked Loop (DLL) 100, according to an exemplary embodiment of the present invention. Referring to FIG. 1, the DLL 100 comprises a level selector 110, a control signal generator 120, and an internal clock signal generator 130. The level selector 110 receives an external clock signal EXCLK, and directly outputs the external clock signal EXCLK, or changes a level of the external clock signal EXCLK and outputs a level-changed external clock signal CHEXCLK, in response to a control signal CTRL.

The control signal generator 120 generates the control signal CTRL. The control signal CTRL allows the external clock signal EXCLK to be directly input to the internal clock signal generator 130, or changes the level of the external clock signal EXCLK and allows the changed external clock signal to be applied to the internal clock signal generator 130. Several methods may be used for generating the control signal CTRL and will be described later.

The internal clock signal generator 130 receives an output signal LVLOUT of the level selector 110 and an external clock signal EXCLK, and generates an internal clock signal INTCLK synchronized to a phase of the output signal LVLOUT of the level selector 110. The operation of the level selector 110, the control signal generator 120, and the internal clock signal generator 130 will be described with reference to FIG. 2.

Figure 2:
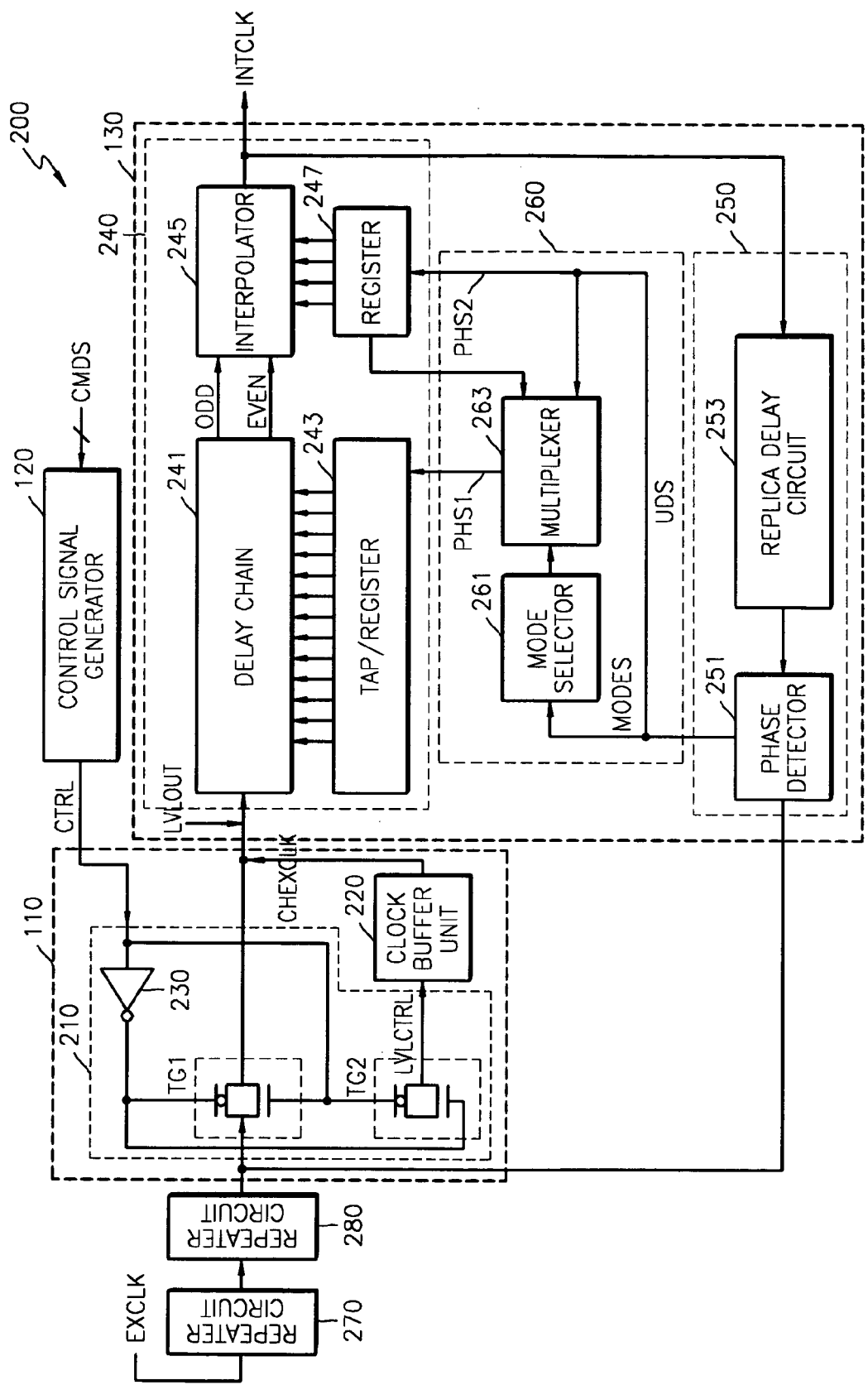
FIG. 2 is a circuit diagram of the DLL of FIG. 1.

FIG. 2 is a circuit diagram of the DLL of FIG. 1. As shown in FIG. 2, the internal clock signal generator 130 comprises a phase controller 240, a feedback unit 250, and a phase control signal generator 260.

The phase controller 240 outputs an output signal LVLOUT of the level selector 110 as an internal clock signal INTCLK, in response to predetermined first and second phase control signals PHS1 and PHS2, respectively. The phase controller 240 comprises a delay chain 241, a tap/register 243, an interpolator 245, and a register 247, wherein the delay chain 241 and the tap/register 243 delay the phase of the output signal LVLOUT of the level selector 110, received by the first phase control signal PHS1, and the interpolator 245 and the register 247 control the phase of the output signal LVLOUT of the level selector 110, received by the second phase control signal PHS2.

The feedback unit 250 compares the phase of the internal clock signal INTCLK output from the phase controller 240 with the phase of the external clock signal EXCLK, and generates an up/down signal UDS and a mode signal MODES. The internal clock signal INTCLK is applied to other circuits connected to a synchronized DLL 200. The DLL 200 is used to synchronize the phase of the internal clock signal INTCLK to the phase of the external clock signal EXCLK. The feedback unit 250 comprises a phase detector 251 and a replica delay circuit 253.

The phase control signal generator 260 generates first and second phase control signals PHS1 and PHS2 for controlling the phase of the output signal LVLOUT of the level selector 110, in response to the mode signal MODES and the up/down signal UDS. The phase control signal generator 260 comprises a mode selector 261 and a multiplexer 263.

The internal clock signal INTCLK is applied to the phase detector 251 through the replica delay circuit 253. The phase detector 251 compares the phase of the external clock signal EXCLK with that of the internal clock signal INTCLK, and generates the up/down signal UDS and the mode signal MODES.

The mode selector 261 determines whether the phase of the output signal LVLOUT of the level selector 110 should be controlled using a large phase interval or using a small phase interval. If the phase of the output signal LVLOUT of the level selector 110 is controlled using the large phase interval, the delay chain 241 is used. If, however, the phase of the output signal LVLOUT of the level selector 110 is controlled using the small phase interval, the interpolator 245 is used.

The multiplexer 263 generates the first phase control signal PHS1 for controlling the delay chain 241, in response to the output signal of the mode selector 261. The up/down signal UDS and the second phase control signal PHS2 are the same. Accordingly, the up/down signal UDS controls the interpolator 245, in response to the comparison result of the phase detector 251.

The output signal LVLOUT of the level selector 110 is controlled with the large phase interval using the delay chain 241, and with the small phase interval using the interpolator 245. This enables an internal clock signal INTCLK with the same phase as the output signal LVLOUT of the level selector 110 to be generated.

To directly apply the external clock signal EXCLK to the internal clock signal generator 130, or change the level of the external clock signal EXCLK and apply the changed external clock signal CHEXCLK to the internal clock signal generator 130, the level selector 110 comprises a selection controller 210 and a clock buffer unit 220.

The selection controller 210 directly applies the external clock signal EXCLK to the internal clock signal generator 130, or outputs the external clock signal EXCLK as a level control signal LVLCTRL, in response to the control signal CTRL.

The selection controller 210 comprises a first transmission gate TG1 which directly applies the external clock signal EXCLK to the internal clock signal generator 130 if a control signal CTRL with a first level is applied, a second transmission gate TG2 which outputs the external clock signal EXCLK as a level control signal LVLCTRL if a control signal CTRL with a second level is applied, and an inverter 230 which inverts a logic level of the control signal CTRL and applies the inverted control signal to the first and the second transmission gates TG1 and TG2.

If the control signal CTRL with the first level is generated, the first transmission gate TG1 is turned on and the external clock signal EXCLK is directly applied to the delay chain 241 of the internal clock signal generator 130. The delay chain 241 includes differential amplifier type analog delay cells with a small swing width. Accordingly, even though an external clock signal EXCLK with a Transistor-Transistor Logic (TTL) level is directly input to the delay chain 241, no error is generated.

If the control signal CTRL with the second level is generated, the second transmission gate TG2 is turned on and the external clock signal EXCLK is output as the level control signal LVLCTRL to the clock buffer unit 220.

The clock buffer unit 220 generates a changed external clock signal CHEXCLK, in response to the level control signal LVLCTRL. The clock buffer unit 220 amplifies the level of the level control signal LVLCTRL to a Complementary Metal Oxide Semiconductor (CMOS) level enabling the clock buffer unit 220 to function as an amplifier.

According to the level of the control signal CTRL, the external clock signal EXCLK with the TTL level is directly applied to the delay chain 241, or is amplified to the CMOS level and then applied to the delay chain 241.

The level of the control signal CTRL is controlled by the control signal generator 120. The control signal generator 120 generates the control signal CTRL in response to command signals. It is to be understood that the control signal CTRL may be a Mode Register Set (MRS) signal generated by a combination of the command signals. In addition, the control signal CTRL may be various signals output and in some instances defined by the configuration of the control signal generator 120, other than the MRS signal generated by the combination of the command signals. Another variant of the control signal generator 120 will be described later.

When applying the external clock signal EXCLK directly to the delay chain 241 according to the control signal with the first level, the delay time consumed by the clock buffer unit 220 can be reduced because the external clock signal EXCLK does not pass through the clock buffer unit 220. Thus, when the DLL 200 is turned on from a power down mode to an operation mode, the turn-on speed becomes faster. In addition, because the clock buffer unit 220 is turned off the current consumed by the clock buffer unit 220 can be reduced.

When the external clock signal EXCLK with the TTL level is input directly to the delay chain 241, along a bus line, the transfer of the external clock signal EXCLK received through an input pin to the delay chain 241 is lengthy and, as a result, an input capacitance of the input pin becomes large. If the input impedance is large, a gradient of the external clock signal EXCLK with the TTL level having a small swing width becomes small and skew becomes large.

To increase signal swing width and reduce skewing, the level selector 110 receives the external clock signal EXCLK through predetermined repeater circuits 270 and 280, which maintain a large gradient of the external clock signal EXCLK. Although, only two repeater circuits 270 and 280 are shown in FIG. 2, it is to be understood that more than two repeater circuits can be used.

It is to be understood that because the delay cells of the delay chain 241 are differential amplifier type analog cells with small swing widths, no error is generated even though the external clock signal EXCLK with the TTL level is applied directly to the delay chain 241. The delay cell of the delay chain 241 is described below.

Figure 3:
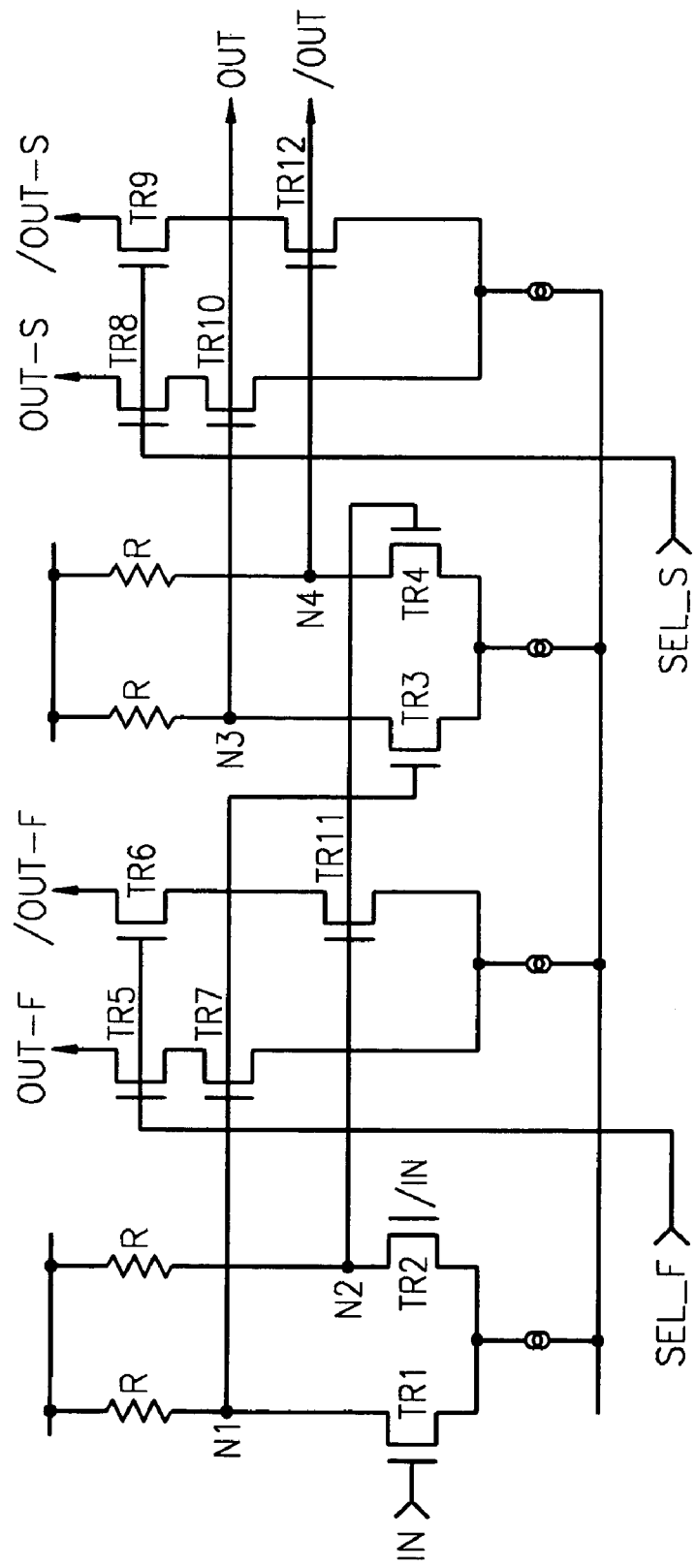
FIG. 3 is a circuit diagram showing a delay cell of a delay chain of FIG. 2.

FIG. 3 is a circuit diagram showing a delay cell 300 of the delay chain 241 of FIG. 2. Referring to FIG. 3, an output signal LVLOUT of the level selector 110 and an inversed signal thereof are input to input terminals IN and /IN of the delay cell 300. When the output signal LVLOUT applied to the input terminal IN is high, a low signal, i.e., the inverse of the output signal LVLOUT, is applied to the input terminal /IN.

Then, when a first node N1 reaches a low level, a second node N2 reaches a high level. As such, a third transistor TR3 is turned off and a fourth transistor TR4 is turned on. Thus, a third node N3 reaches a high level and a fourth node N4 reaches a low level and, signals of the third node N3 and the fourth node N4 are output to another delay cell.

In the case where a first selection signal SEL_F is high, a second selection signal SEL_S is low. Thus, the first and the second selection signals SEL_F and SEL_S are signals ODD and EVEN for controlling the interpolator 245, respectively.

If the first selection signal SEL_F is high, a fifth transistor TR5 and a sixth transistor TR6 are turned on, a seventh transistor TR7 is turned off in response to the low signal of the first node N1, and an eleventh transistor TR11 is turned on in response to the high signal of the second node N2.

Accordingly, an output signal OUT-F of a first cell is output at a high level, and an output signal /OUT-F of a first inverse cell is output at a low level. If the second selection signal SEL_S is low, an eighth transistor TR8 and a ninth transistor TR9 are turned off. The output signal OUT-F of the first cell and the output signal /OUT-F of the first inverse cell are generated as signals ODD and EVEN for controlling the interpolator 245.

Figure 4:
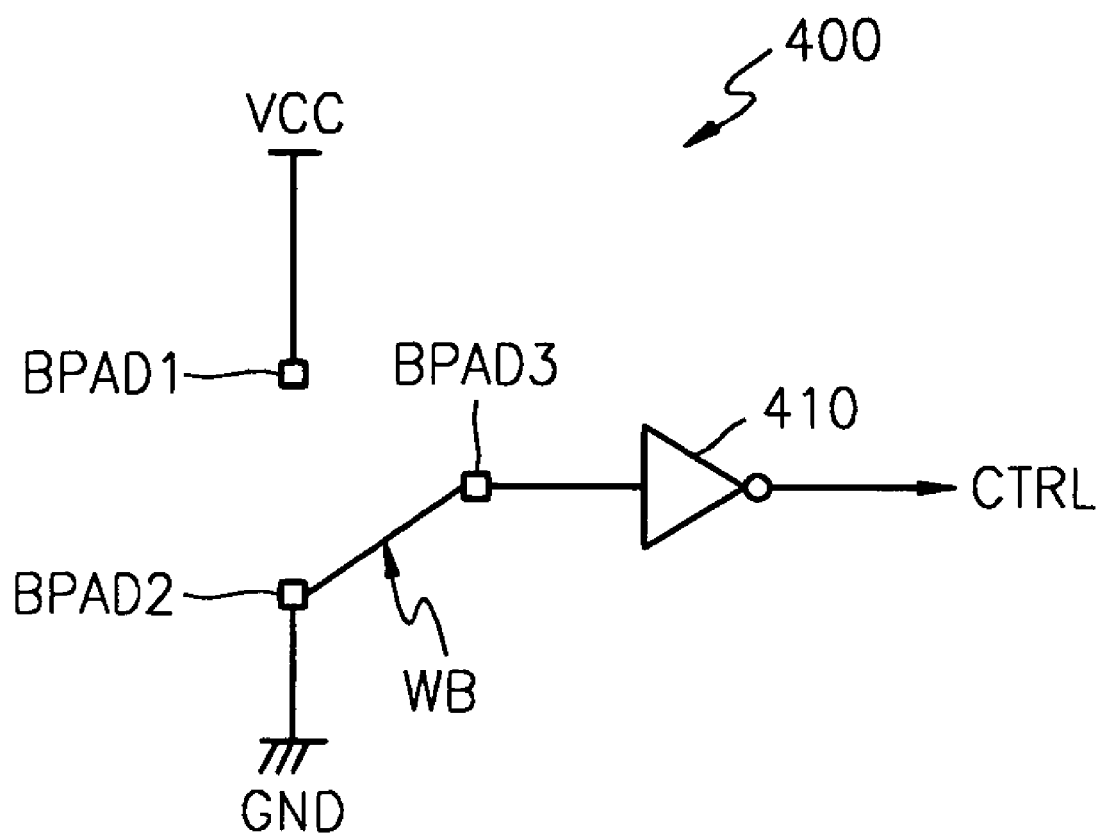
FIG. 4 is a view showing a variant of a control signal generator shown in FIG. 2.

FIG. 4 is a view showing a variant of the control signal generator 120 shown in FIG. 2. The control signal generator 120 of FIG. 2 receives command signals and generates a control signal. A control signal generator 400 of FIG. 4 generates a control signal CTRL through a bonding wire WB.

The control signal generator 400 of FIG. 4 comprises a first bonding pad BPAD1 which is connected to a first voltage VCC, a second bonding pad BPAD2 which is connected to a second voltage GND, and a third bonding pad BPAD3 which is connected to the first bonding pad BPAD1 or the second bonding pad BPAD2 using the bonding wire WB and generates the control signal CTRL. An inverter 410 inverts an output signal of the third bonding pad BPAD3 and outputs the inverted output signal as the control signal CTRL. The inverter 410 is provided to increase a driving capability of the output signal of the third bonding pad BPAD3.

The first voltage VCC is a source voltage, and the second voltage GND is a ground voltage. If the bonding wire WB connects the first bonding pad BPAD1 with the third bonding pad BPAD3, the control signal CTRL is generated with a low level, which turns on the second transmission gate TG2. Accordingly, the external clock signal EXCLK is amplified to the CMOS level by the clock buffer unit 220 and applied to the delay chain 241.

If, however, the bonding wire WB connects the second bonding pad BPAD2 with the third bonding pad BPAD3, the control signal CTRL is generated with a high level, which turns on the first transmission gate TG1. Accordingly, the external clock signal EXCLK with the TTL level is directly applied to the delay chain 241.

It is to be understood that the connections of the bonding wire WB are determined by a designer when the DLL 200 is designed.

Figure 5A:
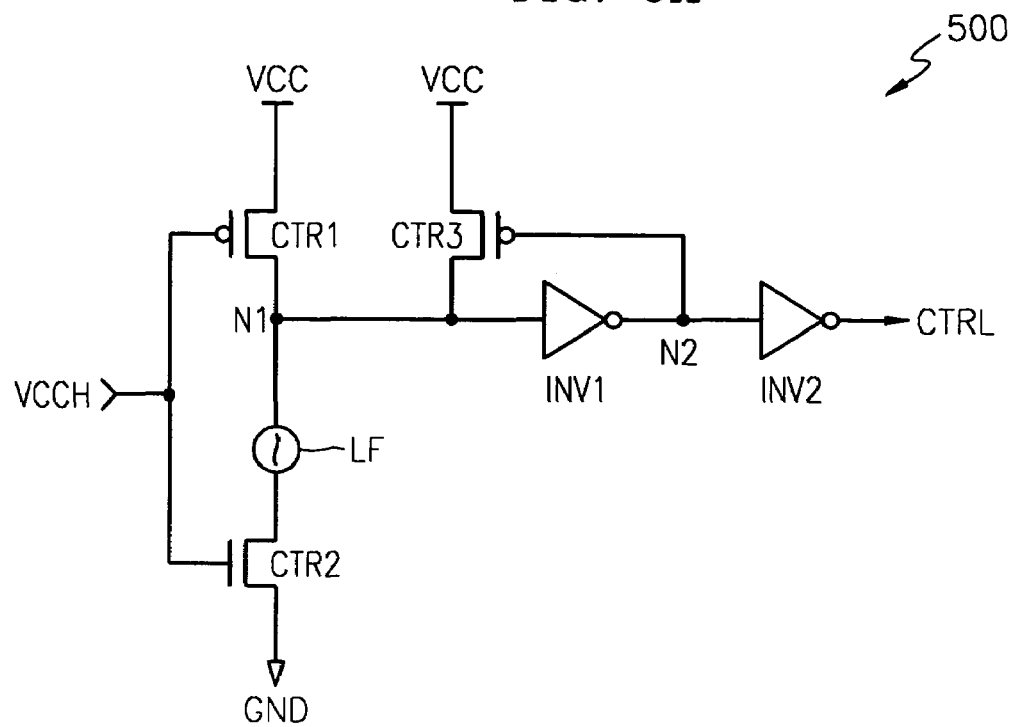
FIG. 5A is a view showing an alternative variant of the control signal generator shown in FIG. 2.

FIG. 5A is a view showing an alternative variant of the control signal generator 120 shown in FIG. 2. A control signal generator 500 of FIG. 5A generates a control signal CTRL through a fuse LF. The control signal generator 500 comprises a first transistor CTR1, a first terminal of which is connected to the first voltage VCC, a gate of which receives a power-up signal VCCH, and a second terminal of which is connected to the first node N1, a second transistor CTR2, a first terminal of which is connected to the first node N1 through the fuse LF, a gate of which receives the power-up signal VCCH, and a second terminal of which is connected to the second voltage GND, a third transistor CTR3, a first terminal of which is connected to the first voltage VCC, a second terminal of which is connected to the first node N1, and a gate of which is connected to the second node N2, a first inverter INV1, an input terminal of which is connected to the first node N1 and an output terminal of which is connected to the second node N2, and a second inverter INV2 which inverts an output signal of the second node N2 and outputs the inverted output signal as a control signal CTRL.

Figure 5B:
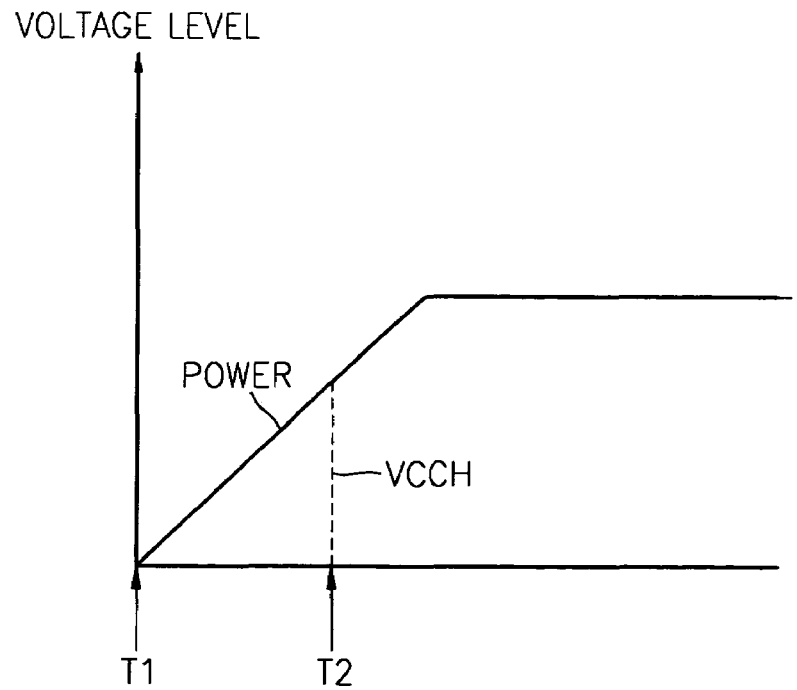
FIG. 5B is a plot illustrating a waveform of a power-up signal.

FIG. 5B is a plot illustrating a waveform of the power-up signal VCCH. Referring to FIG. 5B, the power-up signal VCCH is maintained in a second level during an initial predetermined time period T1–T2 and is changed to a first level when the predetermined time period ends. That is, when power is first turned on, the power-up signal VCCH is generated at a low level. After the predetermined time period T1–T2 ends, the power up signal VCCH is generated at a high level.

If the power up signal VCCH is first generated at the low level, the first transistor CTR1 is turned on and the second transistor CTR2 is turned off. Then, the first node N1 reaches a high level and the second node N2 reaches a low level.

The control signal CTRL is generated at a high level and the third transistor CTR3 is turned on, thereby continuously maintaining the first node N1 high. After the predetermined time T2 elapses, the first transistor CTR1 is turned off and the second transistor CTR2 is turned on if a power-up signal VCCH at a high level is generated.

Thus, the first node N1 reaches a low level and the second node N2 reaches a high level. Accordingly, the control signal is generated at a low level. If the fuse LF is disconnected after the power-up signal VCCH is first generated with the low level, the control signal CTRL is continuously maintained at a high level even though the power-up signal VCCH is changed to the high level.

When the fuse LF is connected, the control signal CTRL is generated with a high level only during the initial short time period T1–T2, and then is generated at the low level after the initial short time period T1–T2 ends. However, when the fuse LF is disconnected, the control signal CTRL is continuously maintained at a high level.

Therefore, to directly apply the external clock signal EXCLK to the delay chain 241, the fuse LF should be disconnected. To amplify the external clock signal EXCLK to the CMOS level and apply the amplified signal to the delay chain 241, the fuse LF should be continuously connected. It is to be understood that the fuse LF may be a laser fuse.

The control signal generator 120 of FIG. 2 can receive the command signals and generate the MRS signal as the control signal CTRL, or can generate the control signal CTRL using the bonding wire WB as shown in FIG. 4. In addition, the control signal generator 120 can generate the control signal CTRL using the fuse LF as shown in FIG. 5.

Figure 6:
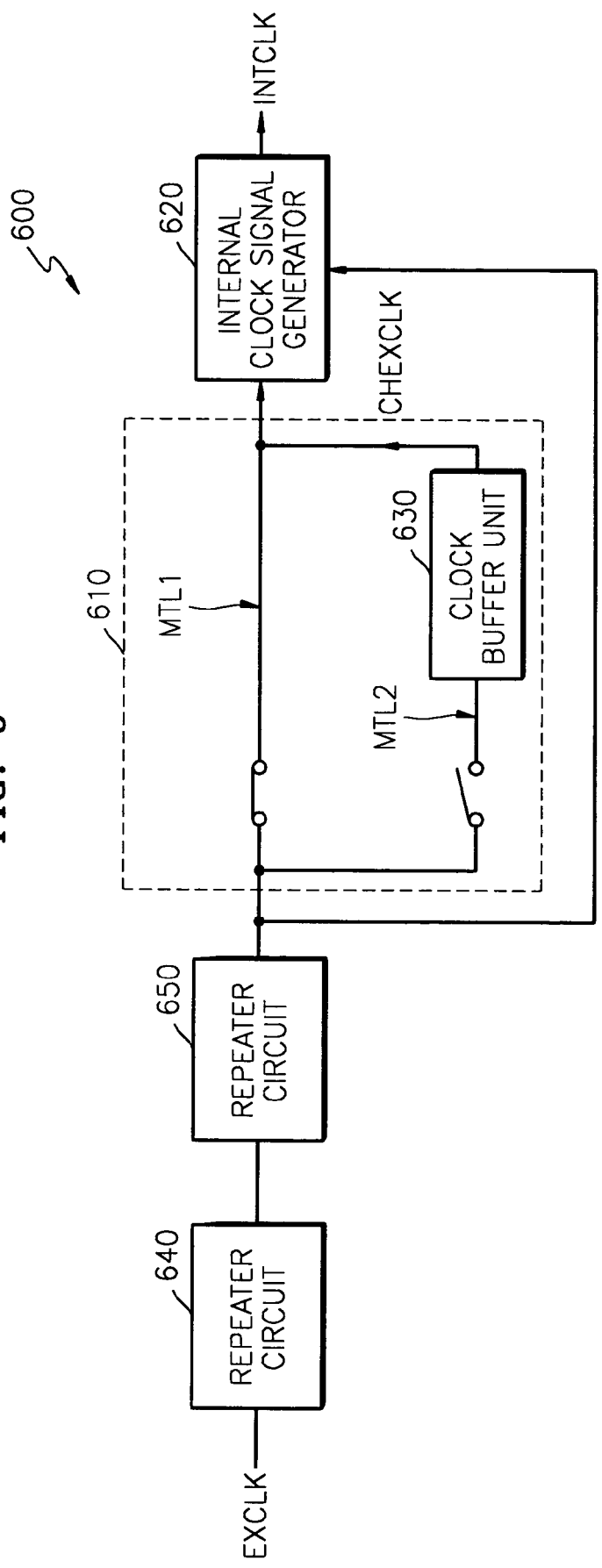
FIG. 6 is a block diagram of a DLL, according to another exemplary embodiment of the present invention.

FIG. 6 is a block diagram of a DLL, according to another exemplary embodiment of the present invention. Referring to FIG. 6, a DLL 600 comprises a level selector 610 and an internal clock signal generator 620. The level selector 610 receives an external clock signal EXCLK, and directly outputs the external clock signal EXCLK, or changes the level of the external clock signal EXCLK and outputs the changed external clock signal CHEXCLK.

The level selector 610 comprises a clock buffer unit 630 which receives the external clock signal EXCLK and outputs the changed external clock signal CHEXCLK, a first metal line MTL1 which directly applies the external clock signal EXCLK to the internal clock signal generator 620, and a second metal line MTL2 which applies the external clock signal EXCLK to the clock buffer unit 630. Initially, only one metal line of the first metal line MTL1 and the second metal line MTL2 is connected, as shown in FIG. 6.

The selection controller 210 corresponding to the level selector 610, as shown in FIG. 2, transmits the external clock signal EXCLK to the delay chain 241 in response to the control signal CTRL. However, the level selector 610 of FIG. 6 does not receive the control signal CTRL.

Rather, when the DLL 600 is manufactured, it is determined whether the external clock signal EXCLK should be applied directly to the internal clock signal generator 620 or whether the external clock signal EXCLK should be amplified to the CMOS level and applied to for example, the delay chain 241 of FIG. 2.

To directly apply the external clock signal EXCLK to the internal clock signal generator 620, the second metal line MTL2 should be disconnected and the first metal line MTL1 should be connected. To amplify the external clock signal EXCLK to the CMOS level and apply the amplified signal to the delay chain 241, the first metal line MTL1 should be disconnected and the second metal line MTL2 should be connected.

As shown in FIG. 6, the switches on the metal lines MTL1 and MTL2 refer to a state wherein one metal line is disconnected (i.e., MTL2) because the switch is open and the other metal line (i.e., MTL1) is connected because the switch is closed.

It is to be understood that the internal clock signal generator 620 has the same or similar construction as the internal clock signal generator 130 in FIG. 2.

FIG. 7 is a block diagram of a DLL, according to yet another exemplary embodiment of the present invention. Referring to FIG. 7, a level selector 710 comprises, a clock buffer unit 730 which receives an external clock signal EXCLK and outputs a converted external clock signal CHEXCLK, a first pad BP1 which receives an external clock signal EXCLK, a second pad BP2 which receives an external clock signal EXCLK, a third pad BP3 which corresponds to the first pad BP1 and is connected to the internal clock signal generator 720, and a fourth pad BP4 which corresponds to the second pad BP2 and is connected to the clock buffer unit 730, wherein the first pad BP1 and the third pad BP3, or the second pad BP2 and the forth pad BP4 are connected by a bonding wire WB.

The level selector 710 does not receive the control signal, like the level selector 210 of FIG. 2. Rather, when the DLL 700 is manufactured, it is determined whether the external clock signal EXCLK should be directly applied to the internal clock signal generator 720 or whether the external clock signal EXCLK should be amplified to the CMOS level and applied to for example, the delay chain 241 of FIG. 2.

To directly apply the external clock signal EXCLK to the internal clock signal generator 720, one connects the first pad BP1 and the third pad BP3 using the bonding wire WB and disconnects the second pad BP2 and the fourth pad BP4. To amplify the external clock signal EXCLK to the CMOS level and apply the amplified signal to the delay chain 241, one disconnects the first pad BP1 and the third pad BP3 and connects the second pad BP2 and the fourth pad BP4.

It is to be understood that the internal clock signal generator 720 has the same or similar construction as the internal clock signal generator 130 of FIG, 2.

In an alternative variant, the first and the third pads BP1 and BP3, and the second and the fourth pads BP2 and BP4 can be connected, respectively, using a fuse. If the fuse is disconnected between the first pad BP1 and the third pad BP3 or between the second pad BP2 and the fourth pad BP4, the same or similar effect as using the bonding wire WB of FIG. 7 is obtained.

FIG. 8 is a block diagram of a DLL, according to another exemplary embodiment of the present invention. Referring to FIG. 8, a DLL 800 comprises a phase controller, a feedback unit, and a phase control signal generator, which are components of an internal clock signal generator 810 and have the same or similar construction, respectively, as those of FIG. 2.

The DLL 800 can selectively directly receive an external clock signal EXCLK, or amplify an external clock signal to a CMOS level and receive the amplified external clock signal. However, the phase controller of the internal clock signal generator 810 directly receives an external clock signal EXCLK from the external.

In other words, an external clock signal with a TTL level is directly applied to a delay chain. It is to be understood that the repeater circuits 820 and 830 have the same or similar functions as those of FIG. 2.

While the present invention has been particularly shown and described with reference to exemplary embodiments thereof, it will be understood by those of ordinary skill in the art that various changes in form and details may be made therein without departing from the spirit and scope of the present invention as defined by the following claims and their equivalents.

What is claimed is:

1. A delay-locked loop (DLL), comprising:
    a level selector, which receives an external clock signal and directly outputs the external clock signal, or changes a level of the external clock signal and outputs a changed external clock signal, in response to a control signal;
    a control signal generator which generates the control signal; and
    an internal clock signal generator, which receives an output signal of the level selector and the external clock signal, and generates an internal clock signal synchronized to a phase of the output signal of the level selector.

2. The DLL of claim 1, wherein the level selector comprises:
    a selection controller, which directly applies the external clock signal to the internal clock signal generator or outputs the external clock signal as a level control signal in response to the control signal; and
    a clock buffer unit, which generates the changed external clock signal in response to the level control signal.

3. The DLL of claim 2, wherein the selection controller comprises:
    a first transmission gate, which directly applies the external clock signal to the internal clock signal generator, in response to a first level of the control signal;
    a second transmission gate, which outputs the external clock signal as the level control signal, in response to a second level of the control signal; and
    an inverter, which inverts a logic level of the control signal and applies the inverted control signal to the first and the second transmission gates.

4. The DLL of claim 2, wherein the clock buffer unit amplifies the level of the level control signal to a complementary metal oxide semiconductor (CMOS) level.

5. The DLL of claim 1, wherein the control signal generator generates the control signal, in response to command signals.

6. The DLL of claim 1, wherein the control signal is a mode register set (MRS) signal.

7. The DLL of claim 1, wherein the control signal generator comprises:
    a first bonding pad;
    a second bonding pad; and
    a third bonding pad, which is connected to the first bonding pad or the second bonding pad using a bonding wire, and generates the control signal.

8. The DLL of claim 1, wherein the control signal generator comprises:
    a first transistor;
    a second transistor;
    a third transistor;
    a first inverter; and
    a second inverter, which inverts an output signal of a second node and outputs the inverted output signal as the control signal.

9. The DLL of claim 8, wherein the fuse is a laser fuse.

10. The DLL of claim 8, wherein the power-up signal is generated with a second level during a time period, and generated with a first level after the time period.

11. The DLL of claim 1, wherein the external clock signal has a Transistor-Transistor Logic (TTL) level.

12. The DLL of claim 1, wherein the internal clock signal generator comprises:
    a phase controller, which outputs a delayed version of the output signal of the level selector as the internal clock signal, in response to first and second phase control signals;

a feedback unit, which compares a phase of the internal clock signal with a phase of the external clock signal and generates an up/down signal and a mode signal; and a phase control signal generator, which generates the first and the second phase control signals for controlling a phase of the output signal of the level selector, in response to the mode signal and the up/down signal;

wherein the phase controller includes a delay chain for receiving the output signal of the level selector.

13. The DLL of claim 12, wherein the delay chain includes differential amplifier type analog delay cells having a small swing width.

14. The DLL of claim 1, wherein the level selector receives the external clock signal through a repeater circuit.

15. A delay-locked loop (DLL) comprising:
a level selector, which receives an external clock signal, and directly outputs the external clock signal, or changes a level of the external clock signal and outputs a changed external clock signal; and an internal clock signal generator, which receives an output signal of the level selector and the external clock signal, and generates an internal clock signal synchronized to a phase of the output signal of the level selector, wherein the level selector receives the external clock signal through a repeater circuit.

16. The DLL of claim 15, wherein the level selector comprises:
a clock buffer unit, which receives the external clock signal and outputs the changed external clock signal;
a first metal line, which directly applies the external clock signal to the internal clock signal generator; and
a second metal line, which applies the external clock signal to the clock buffer unit,
wherein one of the first and the second metal lines is connected and one of the first and the second metal lines is disconnected.

17. The DLL of claim 16, wherein the clock buffer unit amplifies a level of an input signal to a complementary metal oxide semiconductor (CMOS) level.

18. The DLL of claim 15, wherein the level selector comprises:

a clock buffer unit, which receives the external clock signal and outputs the changed external clock signal;
a first pad which receives the external clock signal;
a second pad which receives the external clock signal;
a third pad, which corresponds to the first pad and is connected to the internal clock signal generator; and
a fourth pad, which corresponds to the second pad and is connected to the clock buffer unit;
wherein the first pad and the third pad is connected by a bonding wire or the second pad and the fourth pad is connected by a bonding wire.

19. The DLL of claim 18, wherein the clock buffer unit amplifies a level of an input signal to a CMOS level.

20. The DLL of claim 18, wherein the first and the third pads are connected with a fuse with the second and fourth pads disconnected, or the second and the fourth pads are connected with a fuse with the first and third pads disconnected.

21. The DLL of claim 20, wherein the fuse is a laser fuse.

22. The DLL of claim 15, wherein the external clock signal has a Transistor-Transistor Logic (TTL) level.

23. The DLL of claim 15, wherein the internal clock signal generator comprises:
a phase controller, which outputs a delayed version of the output signal of the level selector as the internal clock signal, in response to first and second phase control signals;
a feedback unit, which compares a phase of the internal clock signal with a phase of the external clock signal and generates an up/down signal and a mode signal; and
a phase control signal generator, which generates first and second control signals for controlling a phase of the output signal of the level selector, in response to the mode signal and the up/down signal,
wherein the phase controller includes a delay chain for receiving the output signal of the level selector.

24. The DLL of claim 23, wherein the delay chain includes differential amplifier type analog delay cells having a small swing width.

* * * * *